(12) United States Patent
Wang et al.

(10) Patent No.: US 7,749,781 B2
(45) Date of Patent: Jul. 6, 2010

(54) METHOD FOR MANUFACTURING A LIGHT-EMITTING DIODE HAVING HIGH HEAT-DISSIPATING EFFICIENCY

(75) Inventors: Bily Wang, Hsin Chu (TW); Jonnie Chuang, Hsin Chu (TW); Miko Huang, Hsin Chu (TW)

(73) Assignee: Harvatek Corporation, Hsin Chu (TW)

( * ) Notice: Subject to any disclaimer, the term of this patent is extended or adjusted under 35 U.S.C. 154(b) by 359 days.

(21) Appl. No.: 11/757,355

(22) Filed: Jun. 2, 2007

(65) Prior Publication Data

US 2008/0194048 A1    Aug. 14, 2008

(30) Foreign Application Priority Data

Feb. 13, 2007    (TW) .............................. 96105230 A

(51) Int. Cl.
*H01L 21/00* (2006.01)
(52) U.S. Cl. .................................. 438/25; 257/E21.499
(58) Field of Classification Search .................. 438/11, 438/22, 24, 25, 26, 27, 29, 112; 257/E33.059
See application file for complete search history.

(56) References Cited

U.S. PATENT DOCUMENTS

| 5,959,316 | A | * | 9/1999 | Lowery | 257/98 |
|---|---|---|---|---|---|
| 5,962,971 | A | * | 10/1999 | Chen | 313/512 |
| 6,274,924 | B1 | | 8/2001 | Carey et al. | |
| 6,299,498 | B1 | * | 10/2001 | Liu et al. | 445/24 |
| 6,345,903 | B1 | * | 2/2002 | Koike et al. | 362/241 |
| 6,756,731 | B1 | * | 6/2004 | Sano | 313/499 |
| 6,917,057 | B2 | * | 7/2005 | Stokes et al. | 257/98 |
| 7,176,623 | B2 | * | 2/2007 | Nitta et al. | 313/512 |
| 7,332,746 | B1 | * | 2/2008 | Takahashi et al. | 257/98 |
| 2003/0122482 | A1 | * | 7/2003 | Yamanaka et al. | 313/512 |
| 2004/0164675 | A1 | * | 8/2004 | Wang et al. | 313/512 |
| 2004/0188700 | A1 | * | 9/2004 | Fukasawa et al. | 257/100 |
| 2004/0189170 | A1 | * | 9/2004 | Aisenbrey | 313/248 |
| 2005/0077623 | A1 | * | 4/2005 | Roberts et al. | 257/724 |
| 2005/0156496 | A1 | * | 7/2005 | Takashima et al. | 313/237 |
| 2005/0161771 | A1 | * | 7/2005 | Suehiro et al. | 257/612 |
| 2005/0227393 | A1 | * | 10/2005 | Sato et al. | 438/25 |
| 2006/0027829 | A1 | * | 2/2006 | Wang et al. | 257/99 |
| 2006/0102936 | A1 | * | 5/2006 | Tomohiro et al. | 257/257 |
| 2006/0170332 | A1 | * | 8/2006 | Tamaki et al. | 313/498 |
| 2006/0186431 | A1 | * | 8/2006 | Miki et al. | 257/100 |
| 2008/0191235 | A1 | * | 8/2008 | Wang et al. | 257/99 |
| 2008/0246397 | A1 | * | 10/2008 | Wang et al. | 313/512 |
| 2009/0045430 | A1 | * | 2/2009 | Seo et al. | 257/99 |

* cited by examiner

*Primary Examiner*—W. David Coleman
*Assistant Examiner*—Latanya Crawford
(74) *Attorney, Agent, or Firm*—Chun-Ming Shih; HDLS IPR Services

(57) ABSTRACT

A method for manufacturing a light-emitting diode having a high heat-dissipating efficiency forms a thickened metal into a plurality of supports. The support has a first electrode and a second electrode thereon. The first electrode is formed with a trough. The chip that emits a visible light or an invisible light is adhered in the trough. Then, two leads are welded on the chip. One end of each of the two leads is welded to the first and second electrodes respectively. Various glues are dotted on the chip, adhesive, leads and the support. Finally, the glue is formed into a seat and lens having a packaged chip, adhesive, leads and support by means of a hot press-forming process.

11 Claims, 7 Drawing Sheets

US 7,749,781 B2

METHOD FOR MANUFACTURING A LIGHT-EMITTING DIODE HAVING HIGH HEAT-DISSIPATING EFFICIENCY

BACKGROUND OF THE INVENTION

1. Field of the Invention

The present invention relates to a light-emitting diode, and in particular to a light-emitting diode having a high heat-dissipating efficiency.

2. Description of Prior Art

Since conventional light-emitting diodes (LED) are small in volume, consume low electricity and are long life, they gradually replace the traditional bulbs and are widely used in traffic signals, automotive indicators, flashlights, mobile phones, lamps and large-sized outdoor signboards. Since the intensity of single traditional light-emitting diode is limited, when in use, a plurality of light-emitting diodes is combined together to form a high-intensity light source, which increases the complexity in manufacturing the light-emitting diode and cost thereof.

In view of the above, high-power light-emitting diodes are developed. The high-power light-emitting diode can generate a light source with an extremely high intensity. In practice, several light-emitting diodes will be sufficient to generate the necessary intensity for illumination and display. Since the high-power light-emitting diodes can generate a light source with an extremely high intensity, an extremely high heat source is generated accordingly. Therefore, in manufacturing a high-power light-emitting diode, a heat dissipator is combined therein. The heat source generated by the light-emitting chip can be dissipated to the outside via the heat dissipator, thereby ensuring the life of the high-power light-emitting diode.

An example of the existing high-power light-emitting diode combined with a heat dissipator therein is disclosed in U.S. Pat. No. 6,274,924 entitled "SURFACE MOUNTABLE LED PACKAGE", in which a metallic frame is first made in manufacturing the light-emitting diode. The metallic frame is formed with a seat that is filled with plastic materials. The center of the seat is formed with a penetrating hole. A reflective cup provided on the heat dissipator is inserted into the penetrating hole. The interior of the reflective cup is provided with an insulating base. After a chip is adhered onto the base, leads are welded between the chip and the frame. Then, an optical lens is packaged on the seat.

When the light-emitting chip disclosed in the above-mentioned patent is lighted up, since the thus-generated heat source is dissipated to the outside via the heat dissipator, an effective heat-dissipating effect can be achieved. However, the steps for manufacturing such kind of high-power light-emitting diode are very complicated and it is necessary to use more apparatuses. As a result, it wastes a lot of working hours and the working procedure is complicated, causing the increase in the manufacturing cost.

SUMMARY OF THE INVENTION

Therefore, in view of the drawbacks in manufacturing the conventional high-power light-emitting diodes, the present invention provides a method for manufacturing a light-emitting diode having a high heat-dissipating efficiency via simple apparatuses whereby the manufacturing cost is substantially reduced.

In order to achieve the above objects, the method for manufacturing a light-emitting diode having a high heat-dissipating efficiency in accordance with the present invention includes the following steps. A thickened metal is first prepared. The thickened metal is formed into a plurality of supports by etching or press-forming techniques. The support has a first electrode and a second electrode thereon. The first electrode is formed with a supporting portion. The supporting portion is formed with a recessed trough and a plurality of penetrating holes. One end of the supporting portion is connected with a conductive pin. The rear surface of the supporting portion is formed with a heat-dissipating protrusion. The second electrode is formed with a welding portion and a conductive pin. The welding portion has a plurality of penetrating holes thereon. A chip that emits a visible light or an invisible light is adhered into the trough of the first electrode via a nonconductive adhesive. Next, two leads are welded on the chip. One end of each of the two leads is welded to the support respectively. Then, glues are dotted on the chip, adhesive, lead and the support. Finally, a plastic material is formed into a seat and lens that has a packaged chip, adhesive, leads and the support by means of a hot press-forming technique.

DETAILED DESCRIPTION OF THE INVENTION

The technical contents and detailed description of the present invention will be made with reference to the accompanying drawings.

Figure 1:
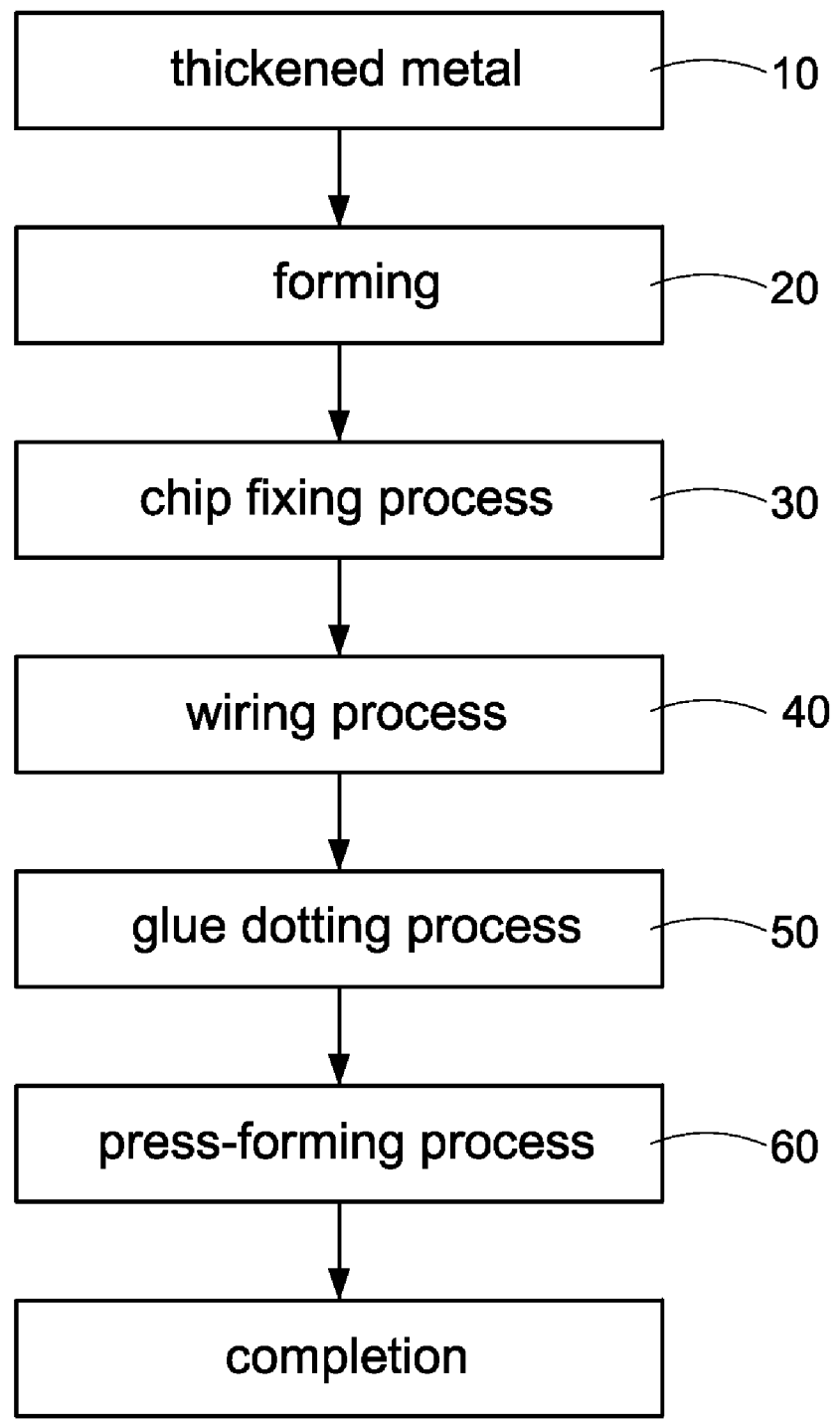
FIG. 1 is a flow chart showing the process of manufacturing the light-emitting diode in accordance with the present invention.

With reference to FIG. 1, it is a flow chart showing the process of manufacturing the light-emitting diode in accordance with the present invention. As shown in this figure, according to the present invention, the method for manufacturing a light-emitting diode having a high-dissipating efficiency begins to prepare a thickened metal in step 10.

In step 20, the thickened metal is formed into a plurality of supports connected with each other by means of an etching or press-forming technique.

In step 30, a chip that emits a visible light or an invisible light is adhered on the support via adhesives, thereby completing the fixing process of the chip. In this figure, the adhesive is any one of a nonconductive or conductive adhesive (such as silver glue or heat-dissipating glue).

In step 40, two leads are welded on the chip. Then, the two leads are welded to the support respectively, thereby completing the wiring process.

In step 50, silicone is dotted on the chip so as to protect the chip. On the surface of the silicone, epoxy resin compound (such as that used in manufacturing a yellow light-emitting diode) is dotted on the chip, the adhesive, the leads and the support. If a white light-emitting diode is to be made, fluorescent glue is first dotted on the chip. Then, silicone is dotted on the fluorescent glue. Thereafter, the epoxy resin is dotted on the silicone.

In step 60, by means of a pressing-forming technique, the compound is formed into a seat and lens having any one of a cylindrical, semi-circular or square shape. With the above steps, the manufacturing process of a light-emitting diode is completed.

Figure 2:
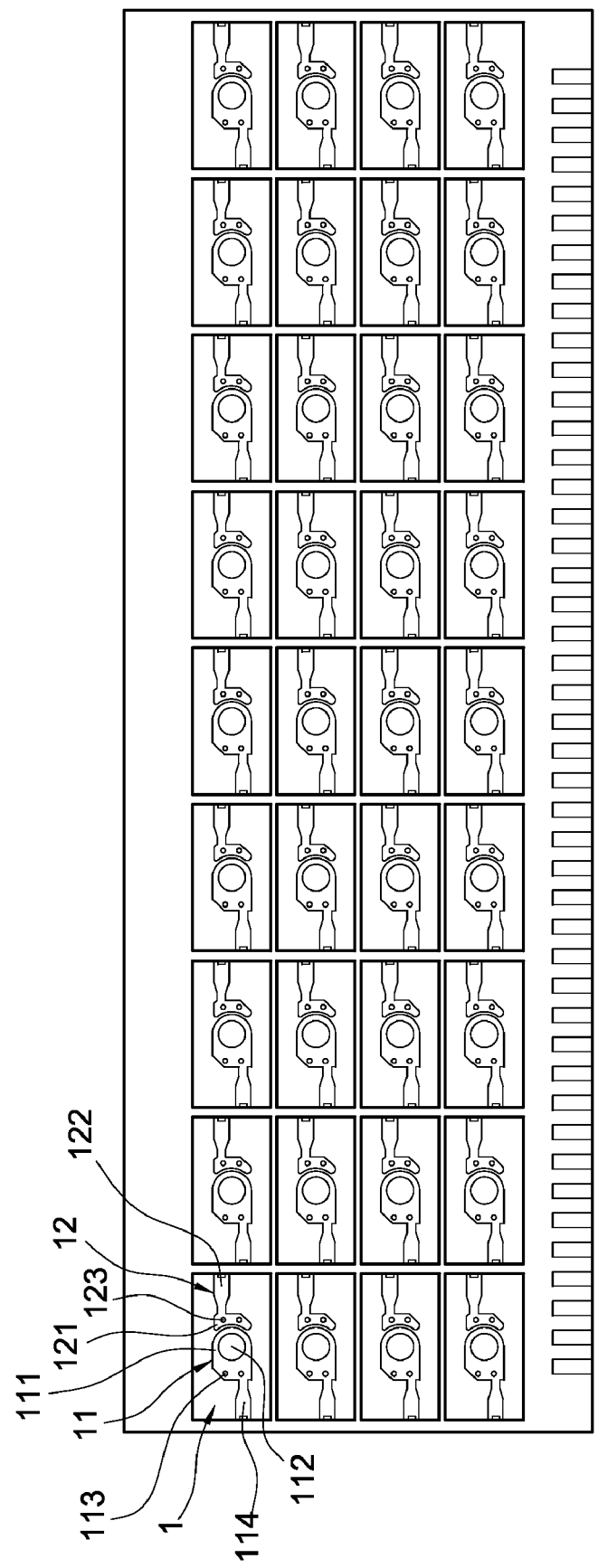
FIG. 2 is a front view showing the support of the present invention.
Figure 3:
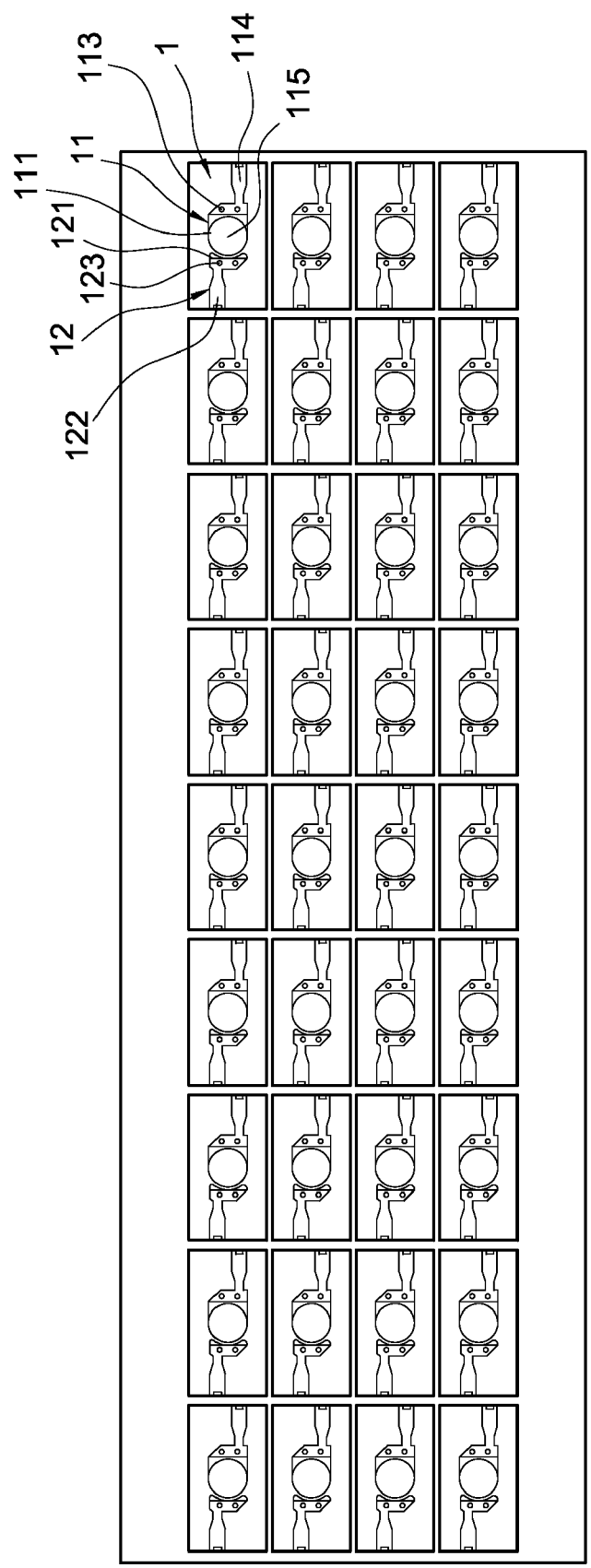
FIG. 3 is a rear view showing the support of the present invention.

With reference to FIGS. 2 and 3, they are the front view and the rear view of the support of the present invention, respectively. As shown in these figures, by means of an etching or pressing technique, the thickened metal is formed into a plurality of supports 1 each having a first electrode 11 and a second electrode 12 continuously connected with each other. The first electrode 11 has a supporting portion 111 thereon. The supporting portion 111 has a circular recessed trough 112 and a plurality of penetrating holes 113. One end of the supporting portion 111 is connected with a conductive pin 114. The rear surface of the supporting portion 111 is formed with a circular heat-dissipating protrusion 115. The second electrode 12 is formed thereon with a welding portion 121 and a conductive pin 122. The welding portion 121 has a plurality of penetrating holes 123. The penetrating holes 113, 123 allow the covering body (not shown) of the light-emitting diode to subsequently pass through the penetrating holes 113, 123 during the hot press-forming process. In this way, the compound of the covering body can be firmly connected with the support 11.

Figure 4:
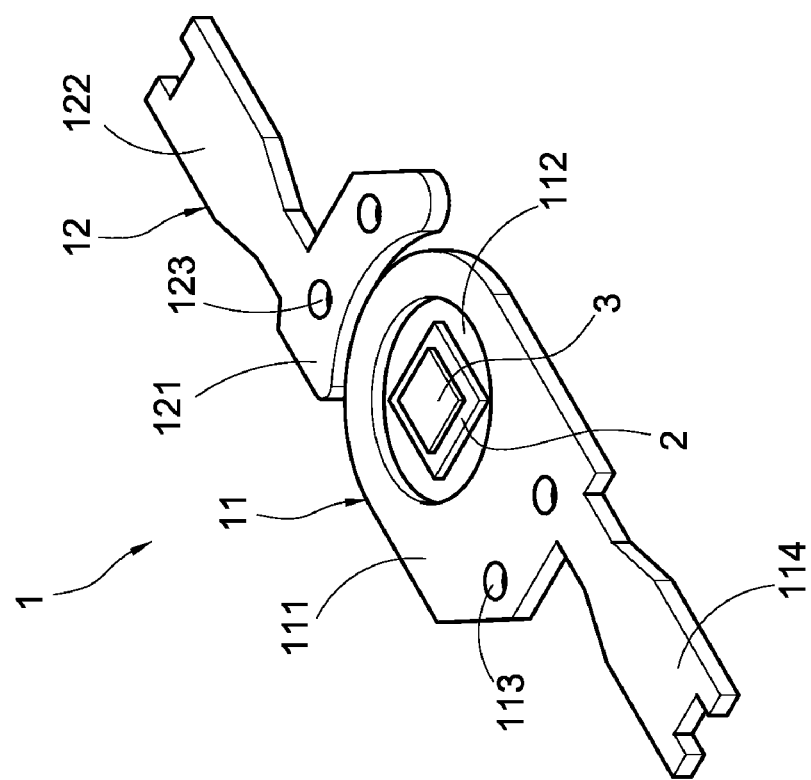
FIG. 4 is a schematic view showing that the chip is adhered on the support of the present invention.

With reference to FIG. 4, it is a schematic view showing that the light-emitting chip is adhered onto the support of the present invention. As shown in the figure, a chip fixing process is performed on the finished support 1. An adhesive 2 is applied on the trough 112 of the first electrode 11. Then, the chip 3 that emits a visible light or an invisible light is adhered into the trough 112. The above adhesive 2 can be any one of a nonconductive adhesive, silver glue or heat-dissipating glue.

Figure 5:
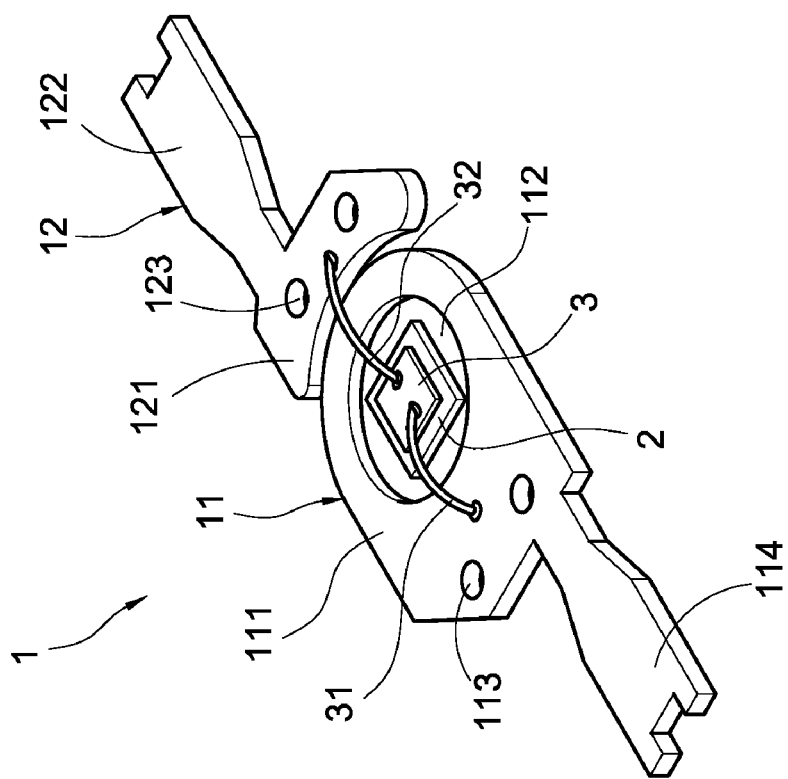
FIG. 5 is a schematic view showing the wiring process of the chip of the present invention.

With reference to FIG. 5, it is a schematic view showing the wiring process of the chip of the present invention. As shown in this figure, after the first electrode 11 of the support 1 is subjected to the chip fixing process, two leads 31, 32 are welded on the chip 3 that emits a visible light or an invisible light. The two leads 31, 32 are electrically connected with the supporting portion 111 of the first electrode 11 and the welding portion 121 of the second electrode 12, respectively. When electricity is supplied to the two leads 31, 32, the chip 3 is electrically conducted.

Figure 6:
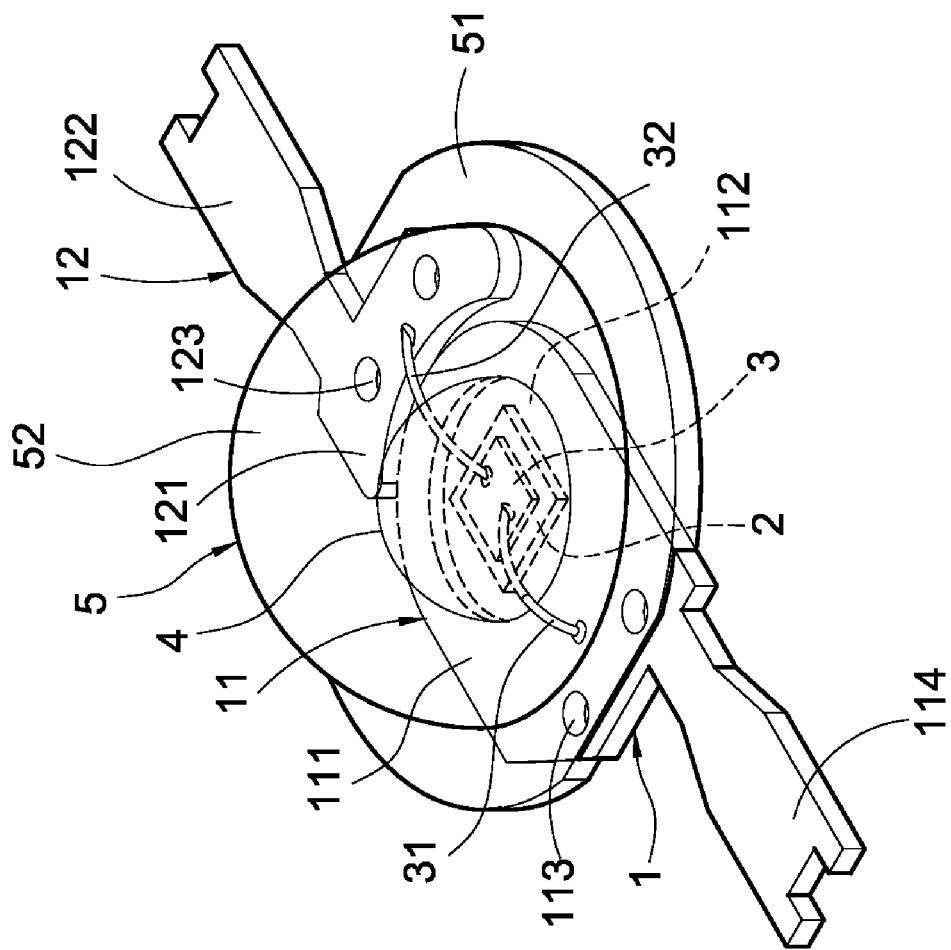
FIG. 6 is a schematic view showing the packaging process of a covering body of the present invention.

With reference to FIG. 6, it is a schematic view showing the packaging process of the covering body of the present invention. As shown in this figure, after the support 1 is subjected to the chip fixing and wiring processes, silicone is dotted on the chip 3 to form an inner covering body 4 so as to protect the chip 3. Then, an outer covering body 5 is covered on the support 1, chip 3, leads 31, 32 and the surface of the inner covering body 4. The outer covering body 5 is an epoxy resin compound. After the compound is formed into an integral seat 51 and lens 52 by means of the hot press-forming technique, the light-emitting diode having a high heat-dissipating efficiency is completed.

Figure 7:
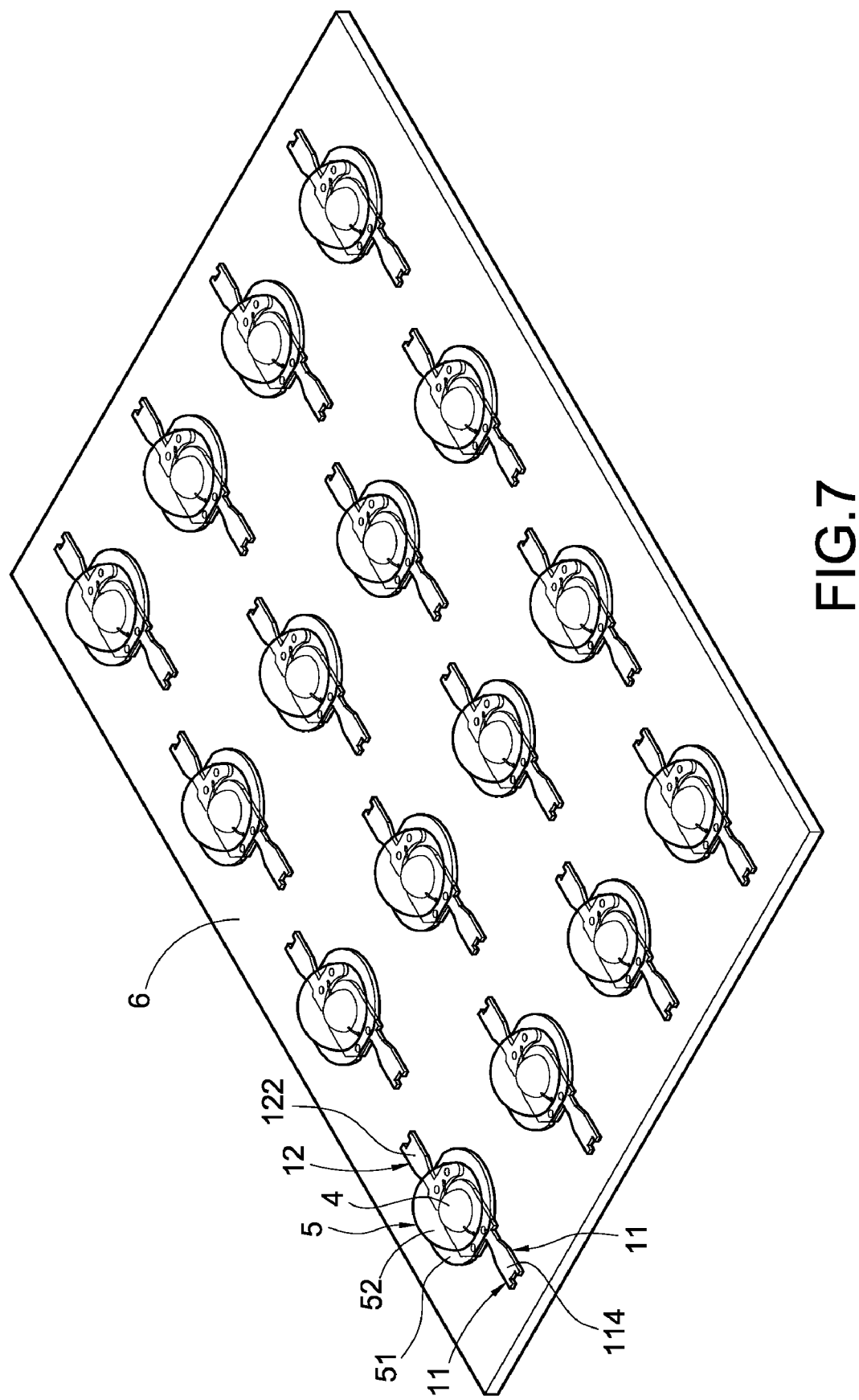
FIG. 7 is a schematic view showing the operating state of the present invention.

With reference to FIG. 7, it is a schematic view showing the operating state of the present invention. As shown in the figure, after the outer covering body 5 is subjected to a hot press-forming process, the rear surfaces of the first electrode 11 and the second electrode 12 of the support 1 are exposed to the outside. After the light-emitting diode is welded to an aluminum plate 6, the rear surfaces of the first electrode 11 and the second electrode 12 completely contact with the aluminum plate 6. When the light-emitting diode is lighted up, the heat energy generated by the light-emitting diode can be conducted to the aluminum plate 6 via the rear surfaces of the first electrode 11 (including the heat-dissipating protrusion 115) and the second electrode 12, thereby increasing the heat-dissipating rate of the light-emitting diode and ensuring the life thereof.

Figure 8:
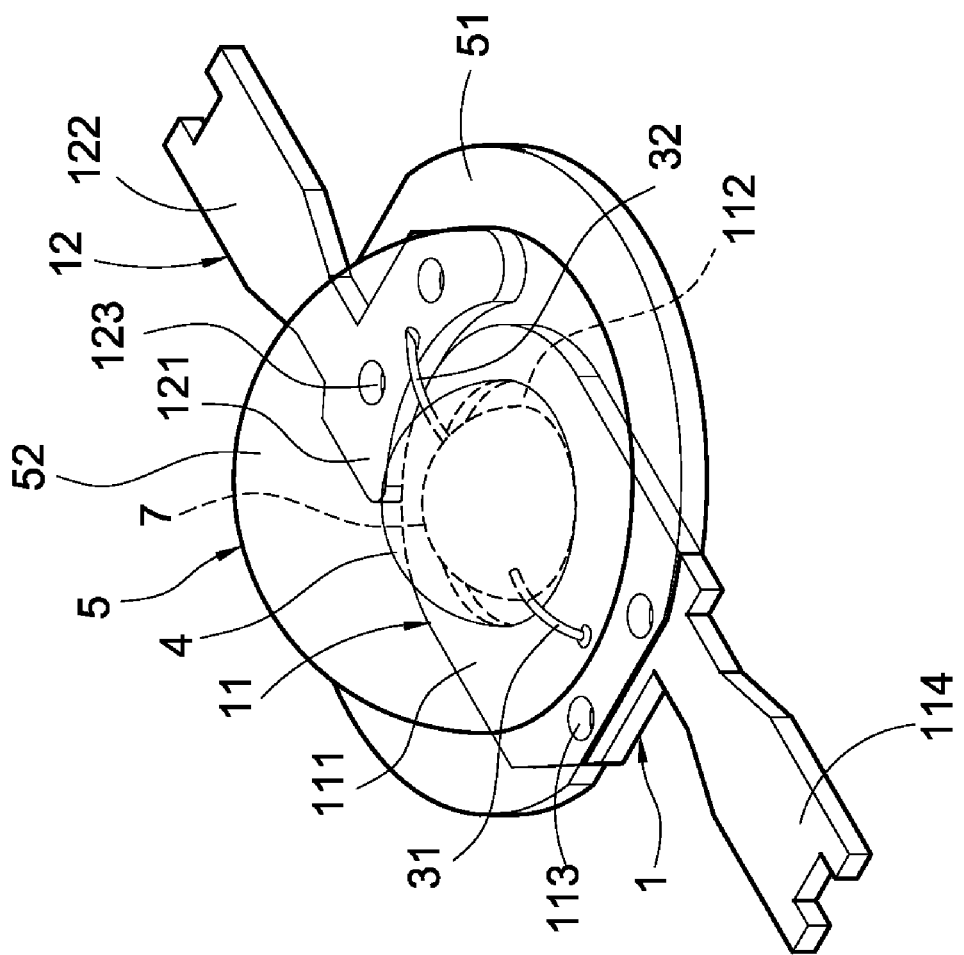
FIG. 8 is a schematic view showing another embodiment of the light-emitting diode of the present invention.

With reference to FIG. 8, it is a schematic view showing another embodiment of the light-emitting diode of the present invention. As shown in the figure, if a white light-emitting diode is to be made, after the manufacturing of the support 1, the chip 3 and leads 31, 32 is completed, a fluorescent glue is dotted on the chip to form a fluorescent layer 7. Silicone is dotted on the fluorescent layer 7 to form an inner covering body 4 so as to protect the chip 3. Then, an outer covering body 5 is covered on the support 1, chip 3, leads 31, 32 and the surface of the inner covering body 4. The outer covering body 5 is an epoxy resin compound. After the compound is formed into an integral seat 51 and lens 52 by means of the hot press-forming technique, the light-emitting diode having a high heat-dissipating efficiency is completed.

With the above manufacturing procedure, it can be understood that the light-emitting diode of the present invention is simple in structure. Further, the manufacturing procedure thereof and the necessary apparatuses are also simple. Therefore, the manufacturing cost of the light-emitting diode can be reduced.

Although the present invention has been described with reference to the foregoing preferred embodiments, it will be understood that the invention is not limited to the details thereof. Various equivalent variations and modifications can still be occurred to those skilled in this art in view of the teachings of the present invention. Thus, all such variations and equivalent modifications are also embraced within the scope of the invention as defined in the appended claims.

What is claimed is:

1. A method for manufacturing a light-emitting diode having a high heat-dissipating efficiency, comprising the steps of:
    a) preparing a thickened metal;
    b) forming the thickened metal into a support having a first electrode and a second electrode, wherein the first electrode has a supporting portion with a trough, the first electrode and the trough are integrally formed in this step;
    wherein the supporting portion of the first electrode formed in the step b) further has a plurality of penetrating holes, one end of the supporting portion is connected with a conductive pin;
    c) applying a layer of adhesive on the trough of the first electrode;
    d) adhering the chip on the adhesive;
    e) welding two leads on the chip, and electrically connecting one end of each of the two leads to the first and second electrodes respectively;
    f) dotting glue on the chip, the first electrode, the second electrode, adhesive, leads and the support; and
    g) forming a thin seat and lens having a packaged chip, adhesive, leads and support by means of a hot press-forming process.

2. The method according to claim 1, wherein the thickened metal is formed into a support by means of an etching technique in the step b).

3. The method according to claim 1, wherein the thickened metal is formed into a support by means of a press-forming technique in the step b).

4. The method according to claim 1, wherein a rear surface of the supporting portion is formed with a circular heat-dissipating protrusion.

5. The method according to claim 1, wherein the second electrode formed in the step b) is formed thereon with a welding portion and a conductive pin, and the welding portion has a plurality of penetrating holes thereon.

6. The method according to claim 1, wherein the adhesive used in the step c) is any one of nonconductive adhesive, silver glue or heat-dissipating glue.

7. The method according to claim 1, wherein the glue dotting process performed in the step f) is to dot silicone on the chip to form an inner covering body, and an outer covering body is then covered on the support, chip, leads and the surface of the inner covering body.

8. The method according to claim 1, wherein the chip is one that emits a visible light.

9. The method according to claim 1, wherein the chip is one that emits an invisible light.

10. The method according to claim 7, wherein a fluorescent glue is formed between the chip and the inner covering body.

11. The method according to claim 7, wherein the outer covering body is an epoxy compound, and the compound is formed into an integral seat and lens by means of the hot press-forming technique.

* * * * *